United States Patent
Liu et al.

(10) Patent No.: US 10,966,346 B2
(45) Date of Patent: Mar. 30, 2021

(54) METHOD, DEVICE AND SYSTEM FOR CONTROLLING HEAT DISSIPATION OF ELECTRICAL CABINET

(71) Applicant: GREE ELECTRIC APPLIANCES, INC. OF ZHUHAI, Guangdong (CN)

(72) Inventors: Keqin Liu, Zhuhai (CN); Yingshuai You, Zhuhai (CN); Chongyang Feng, Zhuhai (CN)

(73) Assignee: GREE ELECTRIC APPLIANCES, INC. OF ZHUHAI, Guangdong (CN)

( * ) Notice: Subject to any disclaimer, the term of this patent is extended or adjusted under 35 U.S.C. 154(b) by 0 days.

(21) Appl. No.: 16/322,056

(22) PCT Filed: Apr. 21, 2017

(86) PCT No.: PCT/CN2017/081459
§ 371 (c)(1),
(2) Date: Jan. 30, 2019

(87) PCT Pub. No.: WO2018/054051
PCT Pub. Date: Mar. 29, 2018

(65) Prior Publication Data
US 2019/0208663 A1    Jul. 4, 2019

(30) Foreign Application Priority Data
Sep. 21, 2016    (CN) .......................... 201610838699.8

(51) Int. Cl.
*H05K 7/20* (2006.01)
*G06F 1/20* (2006.01)
*H05K 5/02* (2006.01)

(52) U.S. Cl.
CPC ........... *H05K 7/20209* (2013.01); *G06F 1/20* (2013.01); *H05K 5/0213* (2013.01); *H05K 7/20136* (2013.01)

(58) Field of Classification Search
None
See application file for complete search history.

(56) References Cited

U.S. PATENT DOCUMENTS

| | | | |
|---|---|---|---|
| 2005/0030716 A1* | 2/2005 | Barsun | G06F 1/20 361/698 |
| 2010/0117579 A1* | 5/2010 | Culbert | G06F 1/20 318/471 |

(Continued)

FOREIGN PATENT DOCUMENTS

| | | |
|---|---|---|
| CN | 101238766 A | 8/2008 |
| CN | 1708213 A | 11/2008 |

(Continued)

OTHER PUBLICATIONS

Duffy, "Current and Resistance", 1999, http://physics.bu.edu/~duffy/PY106/Resistance.html, pp. 1-2 (Year: 1999).*

(Continued)

*Primary Examiner* — Mohammad Ali
*Assistant Examiner* — David Earl Ogg
(74) *Attorney, Agent, or Firm* — Armstrong Teasdale LLP

(57) ABSTRACT

A method, a device and a system for controlling heat dissipation of an electrical cabinet are provided. The method includes: a heating capacity in the electrical cabinet is predicted; according to the heating capacity predicted, a corresponding heat dissipation capacity is determined; and a rotational speed of a heat dissipation fan is controlled, so that a difference between the heating capacity and the heat dissipation capacity is within a predetermined range.

8 Claims, 4 Drawing Sheets

(56) References Cited

U.S. PATENT DOCUMENTS

| | | | |
|---|---|---|---|
| 2012/0210736 A1* | 8/2012 | Rockenfeller | F25B 7/00 62/115 |
| 2014/0248830 A1 | 9/2014 | Bauchot et al. | |
| 2015/0192979 A1* | 7/2015 | Ghose | H04L 69/329 713/320 |
| 2017/0181326 A1* | 6/2017 | Shelnutt | G05D 7/0629 |

FOREIGN PATENT DOCUMENTS

| | | | |
|---|---|---|---|
| CN | 1901791 | A | 11/2009 |
| CN | 102768568 | A | 11/2012 |
| CN | 102804098 | A | 11/2012 |
| CN | 102808796 | B | 12/2012 |
| CN | 105407684 | A | 3/2016 |
| CN | 105792606 | A | 7/2016 |

OTHER PUBLICATIONS

International Search Report for International Application No. PCT/CN2017/081459, dated Jun. 21, 2017, 2 pages.

\* cited by examiner

METHOD, DEVICE AND SYSTEM FOR CONTROLLING HEAT DISSIPATION OF ELECTRICAL CABINET

CROSS-REFERENCE TO RELATED APPLICATIONS

The present application is the national stage entry of International Patent Application No. PCT/CN2017/081459, filed on Apr. 21, 2017, which claims the benefit of priority to Chinese Patent Application No. 201610838699.8, filed on Sep. 21, 2016, the contents of which are hereby incorporated by reference in their entirety.

FIELD

The disclosure relates to the field of electrical cabinets, and in particular to a method, a device and a system for controlling heat dissipation of an electrical cabinet.

BACKGROUND

As a clean energy, an electric energy plays a very vital role in industrial production and daily life of people. Various types of electrical cabinets play an irreplaceable role as terminal devices for controlling the use of the electric energy. However, when these electrical cabinets work normally, there are many challenges. Among them, heat production and heat dissipation of each conductive component in an electrical cabinet are typical problems, and this is a particular case for a high-power electrical cabinet. When the high-power electrical cabinet operates, with a large current, the generated heat is also large and thus a higher requirement is pushed forward for the heat dissipation of the electrical cabinet.

At present, a widely used method for controlling the heat dissipation generally is to detect an environmental temperature in the electrical cabinet, and control a rotational speed of a heat dissipation fan according to a detected temperature value. With a high temperature, the rotational speed is increased and thus the purpose of controlling the heat dissipation of the electrical cabinet is achieved. As shown in FIG. 1, the detected temperature is compared with a set temperature range. In a case where a real-time temperature is lower than a set temperature, a heat dissipation capacity is reduced. In a case where the real-time temperature is higher than the set temperature, the heat dissipation capacity is increased. In a case where the real-time temperature is within the set temperature range, a current status is maintained. Since an inertia for temperature control in the electrical cabinet is large and the temperature changes slowly, after each adjustment process, a time link is increased so as to wait for change and restoration of the temperature. When the temperature is re-detected in a next cycle, a judgment is made again and such a circulation is performed till the temperature in the electrical cabinet reaches a certain value in the set temperature range. To change the heat dissipation capacity of the electrical cabinet mentioned herein is implemented by changing an air volume of an air blower. The control effect of the above-mentioned method is as shown in FIG. 2. Since the inertia for the temperature control in the electrical cabinet is large and the temperature changes slowly, when the heat dissipation capacity is adjusted, a balance cannot be achieved between the heat dissipation capacity and a heating capacity at a time and the temperature is fluctuated. After multiple times of adjustment, the temperature in the electrical cabinet tends to be stable.

However, the widely used method for controlling the heat dissipation at present has many adverse consequences such as the temperature control is lagging, the response performance is poor, the temperature in the cabinet is too high or too low, the rotational speed of the heat dissipation fan is adjusted frequently, the energy waste is caused, and the service life of the heat dissipation fan is reduced. With a large change in a load of the electrical cabinet, the heating capacity also changes a lot, and such a defect is particularly obvious.

Concerning the problem that the existing method for controlling the heat dissipation of the electrical cabinet controls the rotational speed of the heat dissipation fan by detecting the environmental temperature in the electrical cabinet so that the control is lagging and the temperature is easily fluctuated, an effective solution hasn't been proposed yet.

SUMMARY

According to one aspect of the embodiments of the disclosure, a method for controlling heat dissipation of an electrical cabinet is provided, which includes: a heating capacity in the electrical cabinet is predicted; according to the predicted heating capacity, a corresponding heat dissipating capacity is determined; and a rotational speed of a heat dissipation fan is controlled, so that a difference between the heating capacity and the heat dissipating capacity is within a predetermined range.

According to another aspect of the embodiments of the disclosure, a device for controlling heat dissipation of an electrical cabinet is provided, which includes: a prediction component, configured to predict a heating capacity in the electrical cabinet; a determination component, configured to determine, according to the heating capacity predicted, a corresponding heat dissipating capacity; and a control component, configured to control a rotational speed of a heat dissipation fan, so that a difference between the heating capacity and the heat dissipating capacity is within a predetermined range.

According to another aspect of the embodiments of the disclosure, a system for controlling heat dissipation of an electrical cabinet is provided, which includes: a processor, configured to predict a heating capacity in the electrical cabinet, and determine, according to the heating capacity predicted obtained, a corresponding heat dissipating capacity; and a controller, connected with the processor, and configured to control a rotational speed of a heat dissipation fan, so that a difference between the heating capacity and the heat dissipating capacity is within a predetermined range.

According to another aspect of the embodiments of the disclosure, an electrical cabinet is provided, which includes: the system for controlling the heat dissipation of the electrical cabinet in any one of the above embodiments.

BRIEF DESCRIPTION OF THE DRAWINGS

The drawings described here are used to provide further understanding of the disclosure, and constitute a part of the disclosure. The schematic embodiments and description of the disclosure are adopted to explain the disclosure, and do not constitute improper limits to the disclosure. In the drawings.

DETAILED DESCRIPTION OF THE EMBODIMENTS

In order to make those skilled in the art better understand the solutions of the disclosure, the technical solutions in the embodiments of the disclosure are clearly and completely elaborated below with reference to the drawings in the embodiments of the disclosure. Apparently, the described embodiments are a part rather than all of the embodiments of the disclosure. All other embodiments obtained by those of ordinary skill in the art based on the embodiments of the disclosure without creative efforts shall fall within the protection scope of the disclosure.

It should be noted that, terms such as "first" and "second" in the specification, claims and drawings of the disclosure are only used to distinguish similar objects, rather than to describe a special order or a precedence order. It should be understood that objects used in such a way may be interchangeable in a certain cases, such that the embodiments of the disclosure described here can be implemented in an order other than those illustrated or described here. As used herein, the terms "comprises," "comprising," "includes," "including," "has," "having" or any other variation thereof are intended to cover a non-exclusive inclusion. For example, a process, method, article, or device that comprises a list of steps or elements is not necessarily limited to those steps or elements but may include other steps or elements not expressly listed or inherent to such process, method, article, or device.

Embodiment 1

According to an embodiment of the disclosure, a method embodiment of a method for controlling heat dissipation of an electrical cabinet is provided. It is to be noted that steps shown in the flowchart of the drawings may be, for example, executed in a computer system having a group of computer executable instructions. Moreover, although a logical sequence is illustrated in the flowchart, in some cases, the illustrated or described steps may be executed in a sequence different from that herein.

Figure 1:
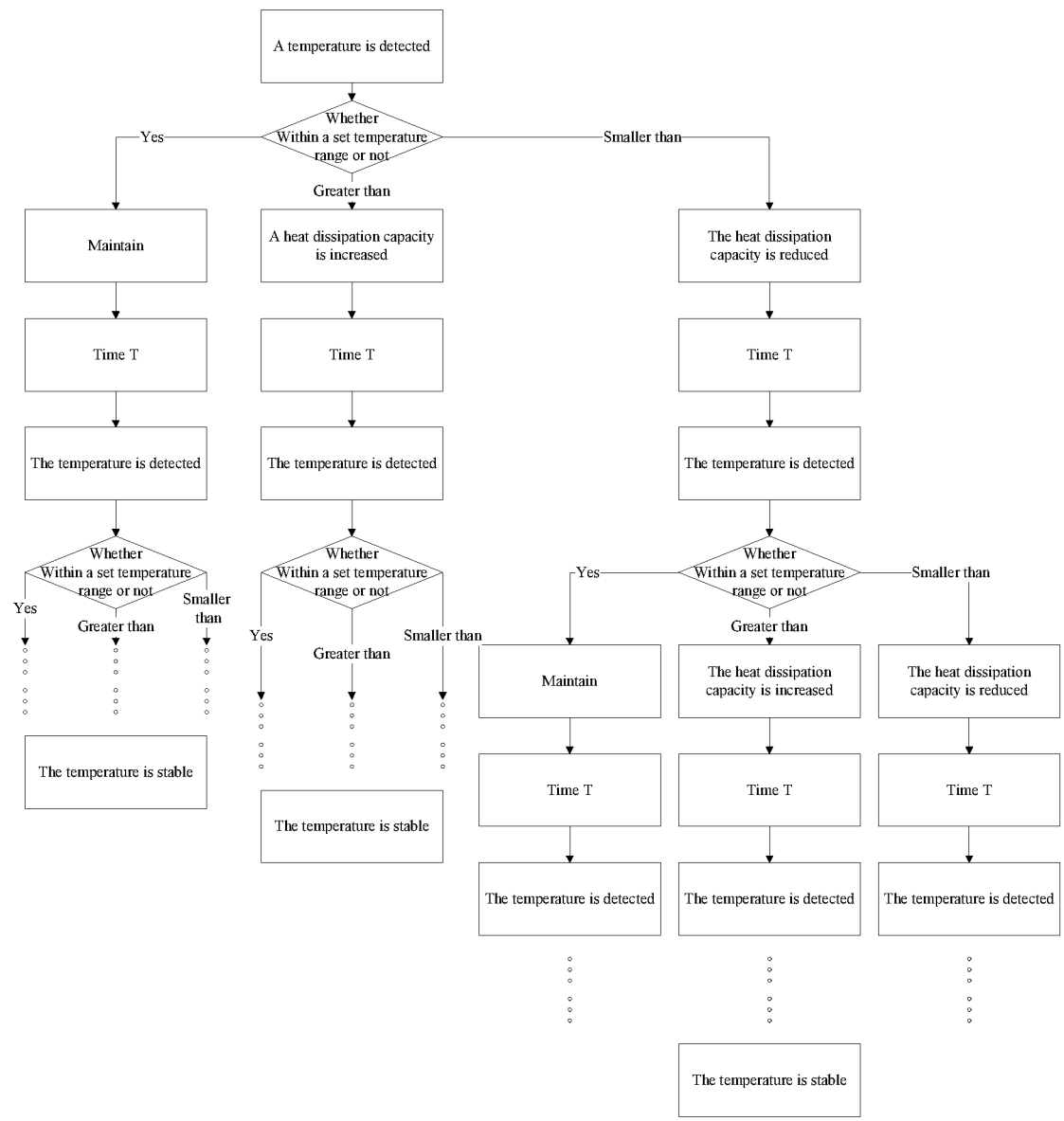
FIG. 1 is a schematic diagram of a method for controlling heat dissipation of an electrical cabinet according to the prior art.
Figure 2:
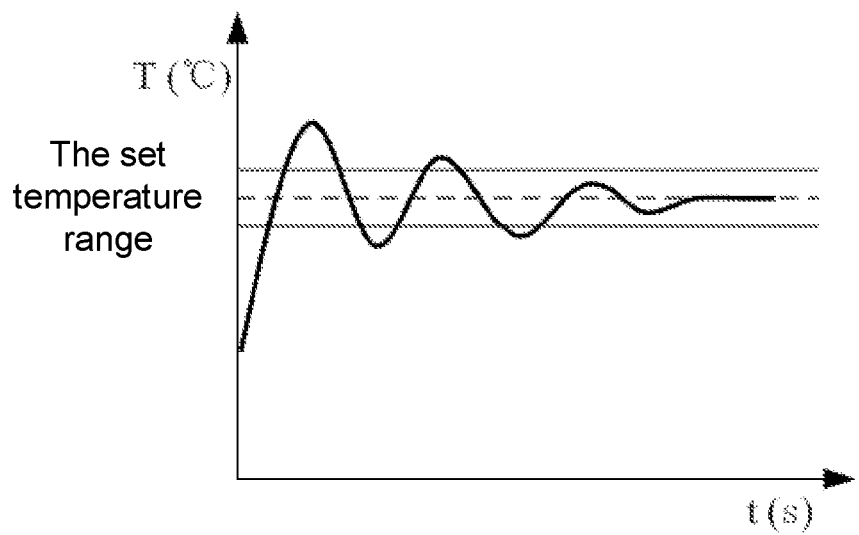
FIG. 2 is an effect schematic diagram of a method for controlling heat dissipation of an electrical cabinet according to the prior art.
Figure 3:
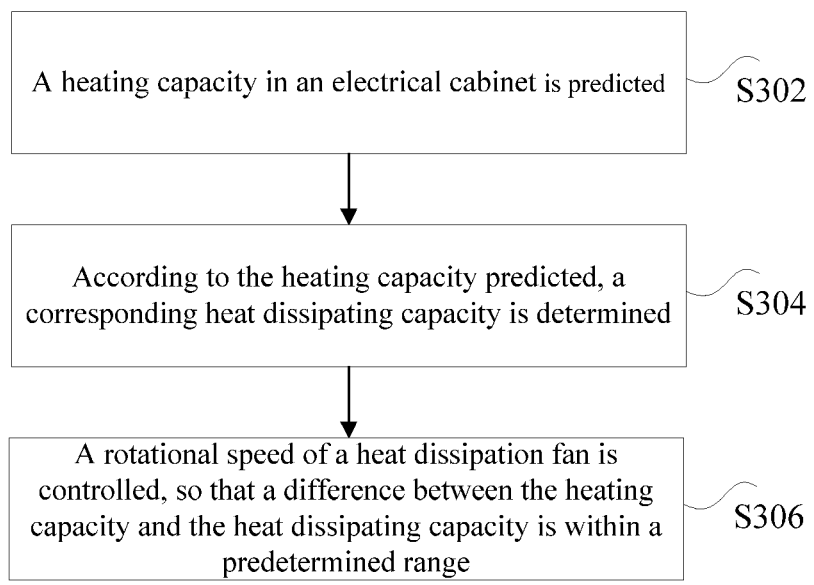
FIG. 3 is a flowchart of a method for controlling heat dissipation of an electrical cabinet according to an embodiment of the disclosure.

FIG. 3 is a flowchart of a method for controlling heat dissipation of an electrical cabinet according to an embodiment of the disclosure. As shown in FIG. 3, the method includes the following steps.

At Step S302, a heating capacity in an electrical cabinet is predicted.

At Step S304, according to the heating capacity predicted, a corresponding heat dissipating capacity is determined.

At Step S306, a rotational speed of a heat dissipation fan is controlled, so that a difference between the heating capacity and the heat dissipating capacity is within a predetermined range.

Specifically, the above-mentioned predetermined range is an error range between the heating capacity and the heat dissipation capacity set in advance according to an actual demand. For example, when the heating capacity and the heat dissipation capacity need to be equal, due to the error cased by predicting or controlling the rotational speed of the heat dissipation fan, an error range may be set in advance, and it may be considered that the heating capacity and the heat dissipating capacity are equal providing that a difference between the heating capacity and the heat dissipating capacity is within the error range.

In an optional solution, during the operation of the electrical cabinet, the heating capacity in the electrical cabinet is accurately predicted, and a corresponding heat dissipation capacity is matched according to the heating capacity. Generally, since an air circulation power is provided by the heat dissipation fan for the heat dissipation of the electrical cabinet and the heat dissipation is performed in a manner of moving in cold air and moving out hot air, the difference between the heating capacity and the heat dissipating capacity is within the predetermined range by controlling the rotational speed of the heat dissipation fan, so that the balance between the heating capacity and the heat dissipating capacity is achieved.

With the adoption of the above embodiment of the disclosure, the heating capacity in the electrical cabinet is predicted; according to the heating capacity predicted, the corresponding heat dissipation capacity is determined; and the rotational speed of the heat dissipation fan is controlled, so that the difference between the heating capacity and the heat dissipating capacity is within the predetermined range; and therefore, the heat dissipation control of the electrical cabinet is implemented. It is easily to be noted that since the heating capacity in the electrical cabinet is directly predicted, and a matched heat dissipation capacity is determined according to the heating capacity, the waste of the heat dissipation capacity is prevented. By further controlling the rotational speed of the heat dissipation fan, the balance between the heating capacity and the heat dissipating capacity is achieved, a temperature in the electrical cabinet is gradually stable, and a phenomenon that the temperature is fluctuated up and down is not occurred. Moreover, an air velocity of the heat dissipation fan is stable, so the heat dissipation fan does not need to be adjusted frequently, and thus the technical problem that the existing method for controlling the heat dissipation of the electrical cabinet controls the rotational speed of the heat dissipation fan by detecting the environmental temperature in the electrical cabinet so that the control is lagging and the temperature is easily fluctuated is solved. Therefore, through the above embodiment of the disclosure, the purposes that the temperature in the electrical cabinet is controlled and responded timely, the service life of the heat dissipation fan is effectively improved, and the temperature in the electrical cabinet is quickly stabilized is implemented.

Optionally, in the above embodiment of the disclosure, the step S302 that the heating capacity in the electrical cabinet is predicted includes the following steps.

At Step S3022, current data, detected by a current sensor, of a conductor in the electrical cabinet are acquired.

At Step S3024, an equivalent resistance of the conductor is acquired.

At Step S3026, according to the current data and the equivalent resistance, a heat load of the electrical cabinet is obtained, wherein the heat load is the heating capacity predicted.

In an optional solution, the conductor in the electrical cabinet generally is a copper bar or a copper cable. The equivalent resistance of the conductor in the electrical cabinet is calculated according to a resistance formula of the conductor, the current data detected by the current sensor in the electrical cabinet are acquired, and a heating power is calculated according to a heating power formula of the conductor. As the current data are monitored in real time, the heating power is a real-time heat load of the electrical cabinet.

Optionally, in the above embodiment of the disclosure, the equivalent resistance R of the conductor in the electrical cabinet and the heat load P of the electrical cabinet are calculated via the following formulas.

$$R=\rho*L/S$$

$$P=I^2R$$

Wherein, the $\rho$ is a specific resistance, the L is a length of the conductor in the electrical cabinet, the S is a cross sectional area of the conductor in the electrical cabinet, and the I is the current data.

In an optional solution, according to the resistance formula of the conductor, $R=\rho*L/S$, the equivalent resistance R of the conductor in the electrical cabinet is calculated, wherein the unit of the equivalent resistance R is $\Omega$, the unit of the specific resistance $\rho$ is $\Omega*mm^2/m$, the unit of the length L of the conductor is m, and the unit of the cross sectional area S of the conductor is $mm^2$; and according to the heating power formula of the conductor, $P=I^2R$, the heating power P, that is, the heat load of the electrical cabinet, is calculated, wherein the unit of the heating power P is w, and the unit of the current data I is A.

Optionally, in the above embodiment of the disclosure, the step S304 that according to the heating capacity predicted, the corresponding heat dissipating capacity is determined includes the following step.

At Step S3040, the heating predicted capacity is taken as a heat dissipating capacity.

In an optional solution, during the operation of the electrical cabinet, since the current data I are known, a real-time heating capacity P of a cabinet body may be directly predicted; then, the rotational speed of the heat dissipation fan is controlled, so that the heat dissipation capacity Q is equal to the heating capacity P, that is $Q=P=I^2R$. At this moment, the heating capacity of the cabinet body is equal to the heat dissipation capacity, so neither a phenomenon that the heating capacity is greater than the heat dissipation capacity and the temperature in the cabinet is increased nor a phenomenon that the heating capacity is smaller than the heat dissipation capacity and the temperature in the cabinet is reduced is occurred. The temperature in the electrical cabinet is gradually stable to be close to a room temperature.

Optionally, in the above embodiment of the disclosure, the step S304 that according to the heating capacity predicted, the corresponding heat dissipating capacity is determined includes the following step.

At Step S3042, a difference between the heating capacity in the electrical cabinet and a first preset threshold value is calculated to obtain a difference value.

Specifically, the above-mentioned first preset threshold value may be a threshold value set according to the actual demand when the heat dissipation capacity is smaller than the heating capacity.

At Step S3044, the difference value is taken as the heat dissipation capacity.

In an optional solution, since a working temperature range of an electrical component generally is higher than the room temperature, the heat dissipation capacity is reduced by appropriately lowering the rotational speed of the heat dissipation fan, so that the heat dissipation capacity Q is slightly smaller than the heating capacity P in the electrical cabinet: $Q<P=I^2R$. At this moment, the temperature in the electrical cabinet gradually reaches a value slightly higher than a surrounding environmental temperature outside the electrical cabinet, and at last a balance is achieved, and the heat of a portion of which the heating capacity is greater than the heat dissipation capacity is transferred to a surrounding environment via a surface of the cabinet body of the electrical cabinet.

Optionally, in the above embodiment of the disclosure, the step S304 that according to the heating capacity predicted, the corresponding heat dissipating capacity is determined includes the following steps.

At Step S3046, a sum for the heating capacity in the electrical cabinet and a second preset threshold value is calculated to obtain a sum value.

Specifically, the above-mentioned second preset threshold value may be a threshold value set according to the actual demand when the heat dissipation capacity is greater than the heating capacity.

At Step S3048, the sum value is taken as the heat dissipation capacity.

In an optional solution, in a case where a component in the electrical cabinet needs a low temperature, the heat dissipation capacity is increased, so that the heat dissipation capacity is slightly higher than the heating capacity in the electrical cabinet: $Q>P=I^2R$. At this moment, the temperature in the electrical cabinet gradually reaches to a value slightly lower than the surrounding environmental temperature outside the electrical cabinet, and at last a balance is achieved. Since the heating capacity is smaller than the heat dissipation capacity, the surrounding environment transfers the heat to the electrical cabinet via the surface of the cabinet body of the electrical cabinet. However, the above method is disadvantageous to a utilization rate of the energy, and excessive heat dissipation capacity is wasted.

Optionally, in the above embodiment of the disclosure, after the step S304 that the corresponding heat dissipation capacity is determined, the method may further include a step S308 that a rotational speed of the heat dissipation fan is calculated according to the heat dissipation capacity. The step S308 that the rotational speed of the heat dissipation fan is calculated according to the heat dissipation capacity includes the following steps.

At Step S3082, a heat dissipation air flow is obtained according to the heat dissipation capacity.

At Step S3084, the rotational speed of the heat dissipation fan is determined according to the heat dissipation air flow.

In an optional solution, since an air circulation power is provided by the heat dissipation fan for the heat dissipation of the electrical cabinet and the heat dissipation is performed in a manner of moving in cold air and moving out hot air, the heat dissipation air flow is obtained according to a formula of the heat that can be taken away by air circulation and heat dissipation. At this moment, only by controlling the heat dissipation air flow, the heat dissipation capacity is controlled, and the heat dissipation air flow is implemented by controlling the rotational speed of the heat dissipation fan.

Optionally, in the above embodiment of the disclosure, the heat dissipation air flow V is calculated via a following formula.

$$Q=V*\Delta T/f$$

Wherein, the Q is the heat dissipation capacity, the ΔT is a temperature difference of air between an inlet and an outlet of the electrical cabinet, and the f is a balance coefficient.

Specifically, the temperature difference ΔT of the air between the inlet and the outlet of the electrical cabinet generally is 15, and may also be obtained by an experiment; and the balance coefficient f generally is 3.3.

In an optional solution, according to the formula of the heat that can be taken away by the air circulation and the heat dissipation Q=V*ΔT/f, the heat dissipation air flow V is obtained, wherein the unit of the heat dissipation capacity Q is w, the unit of the heat dissipation air flow V is m³, the unit of the temperature difference ΔT of the air between the inlet and the outlet is □, and the unit of the balance coefficient f is □*m³/w.

Figure 4:
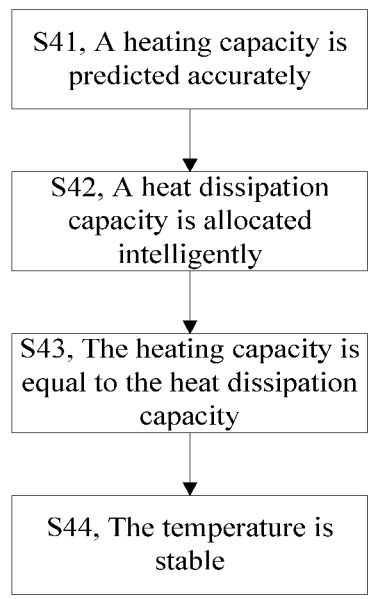
FIG. 4 is a flowchart of an optional method for controlling heat dissipation of an electrical cabinet according to an embodiment of the disclosure.

FIG. 4 is a flowchart of an optional method for controlling heat dissipation of an electrical cabinet according to an embodiment of the disclosure. A preferred method for controlling heat dissipation of an electrical cabinet will be described below in detail in combination with FIG. 4. As shown in FIG. 4, the method includes the following steps.

At Step S41, a heating capacity is predicted accurately.

Optionally, the equivalent resistance of the conductor in the electrical cabinet is calculated according to the resistance formula of the conductor, and then, the heating power (that is a real-time heat load of the electrical cabinet and the heating capacity) is calculated according to the heating power formula of the conductor.

At Step S42, a heat dissipation capacity is allocated intelligently.

Optionally, the heat dissipation air flow is obtained according to the formula of heat that can be taken away by air circulation and heat dissipation. The heat dissipation capacity may be controlled by controlling the heat dissipation air flow, and the heat dissipation air flow is implemented by controlling the rotational speed of the heat dissipation fan.

At Step S43, the heating capacity is equal to the heat dissipation capacity.

Optionally, during the operation of the electrical cabinet, since current data are known, the real-time heating capacity of the electrical cabinet is predicted directly; and then, by controlling the rotational speed of the heat dissipation fan, the heat dissipation air flow changes, so that the heat dissipation capacity is equal to the heating capacity.

At Step S44, the temperature is stable.

Figure 5:
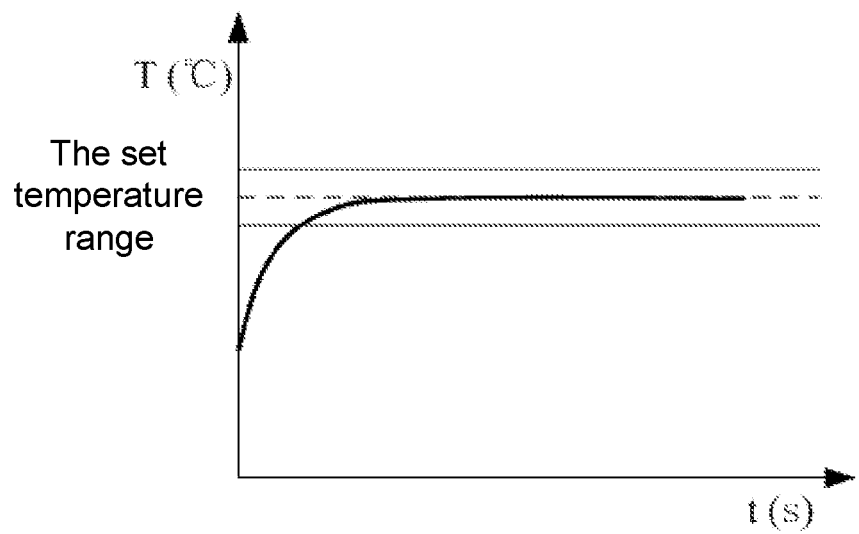
FIG. 5 is an effect schematic diagram of an optional method for controlling heat dissipation of an electrical cabinet according to an embodiment of the disclosure.

Optionally, the heating capacity of the cabinet body of the electrical cabinet is equal to the heat dissipation capacity, so neither the phenomenon that the heating capacity is greater than the heat dissipation capacity and the temperature in the cabinet is increased nor the phenomenon that the heating capacity is smaller than the heat dissipation capacity and the temperature in the cabinet is reduced is occurred. The temperature in the electrical cabinet is gradually stable to be close to the room temperature. FIG. 5 is an effect schematic diagram of an optional method for controlling heat dissipation of an electrical cabinet according to an embodiment of the disclosure. As shown in FIG. 5, the temperature in the electrical cabinet is increased stably, is gradually stable and is not fluctuated.

Through the step S41 to the step S44, the heating capacity in the electrical cabinet is accurately predicted, and thus the heat dissipation capacity is allocated intelligently, the temperature in the cabinet is stabilized stably, and the problems of lagging temperature control and fluctuation are prevented. Moreover, the following technical effects are achieved.

1. The temperature in the electrical cabinet is controlled and responded timely, the temperature control is stable, and the temperature fluctuation is not occurred.

2. The rotational speed of the heat dissipation fan is controlled stably and is not adjusted frequently, and thus the service life of the fan is effectively improved.

3. The heating capacity of the component in the electrical cabinet is predicted accurately, and the heat dissipation capacity is allocated intelligently, thereby the purpose of quickly stabilizing the temperature in the cabinet is achieved.

Embodiment 2

According to an embodiment of the disclosure, a device embodiment of a device for controlling heat dissipation of an electrical cabinet is provided.

Figure 6:
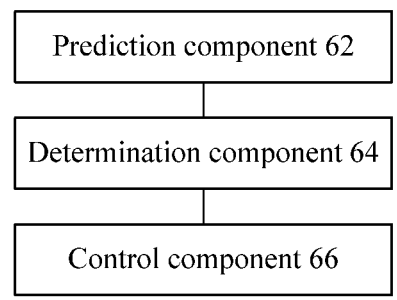
FIG. 6 is a schematic diagram of a device for controlling heat dissipation of an electrical cabinet according to an embodiment of the disclosure.

FIG. 6 is a schematic diagram of a device for controlling heat dissipation of an electrical cabinet according to an embodiment of the disclosure. As shown in FIG. 6, the device includes a prediction component 62, a determination component 64, and a control component 66.

The prediction component 62 is configured to predict a heating capacity in the electrical cabinet.

The determination component 64 is configured to determine, according to the heating capacity predicted, a corresponding heat dissipating capacity.

The control component 66 is configured to control a rotational speed of a heat dissipation fan, so that a difference between the heating capacity and the heat dissipating capacity is within a predetermined range.

Specifically, the above-mentioned predetermined range is an error range between the heating capacity and the heat dissipation capacity set in advance according to an actual demand. For example, when the heating capacity and the heat dissipation capacity need to be equal, due to the error cased by predicting or controlling the rotational speed of the heat dissipation fan, an error range may be set in advance, and it may be considered that the heating capacity and the heat dissipating capacity are equal providing that a difference between the heating capacity and the heat dissipating capacity is within the error range.

In an optional solution, during the operation of the electrical cabinet, the heating capacity in the electrical cabinet is accurately predicted, and a corresponding heat dissipation capacity is matched according to the heating capacity. Generally, since an air circulation power is provided by the heat dissipation fan for the heat dissipation of the electrical cabinet and the heat dissipation is performed in a manner of moving in cold air and moving out hot air, the difference between the heating capacity and the heat dissipating capacity is within the predetermined range by controlling the rotational speed of the heat dissipation fan, so that the balance between the heating capacity and the heat dissipating capacity is achieved.

It is to be noted that the prediction component 62, the determination component 64 and the control component 66 may run in the electrical cabinet as a part of the device, and functions implemented by the components may be executed by a processor in the electrical cabinet.

With the adoption of the above embodiment of the disclosure, the heating capacity in the electrical cabinet is predicted; according to the heating capacity predicted, the corresponding heat dissipation capacity is determined; and the rotational speed of the heat dissipation fan is controlled, so that the difference between the heating capacity and the heat dissipating capacity is within the predetermined range; and therefore, the heat dissipation control of the electrical cabinet is implemented. It is easily to be noted that since the heating capacity in the electrical cabinet is directly predicted, and a matched heat dissipation capacity is determined according to the heating capacity, the waste of the heat dissipation capacity is prevented. By further controlling the rotational speed of the heat dissipation fan, the balance between the heating capacity and the heat dissipating capacity is achieved, a temperature in the electrical cabinet is gradually stable, and a phenomenon that the temperature is fluctuated up and down is not occurred. Moreover, an air velocity of the heat dissipation fan is stable, so the heat dissipation fan does not need to be adjusted frequently, and thus the technical problem that the existing method for controlling the heat dissipation of the electrical cabinet controls the rotational speed of the heat dissipation fan by detecting the environmental temperature in the electrical cabinet so that the control is lagging and the temperature is easily fluctuated is solved. Therefore, through the above embodiment of the disclosure, the purposes that the temperature in the electrical cabinet is controlled and responded timely, the service life of the heat dissipation fan is effectively improved, and the temperature in the electrical cabinet is quickly stabilized is implemented.

Embodiment 3

According to an embodiment of the disclosure, a system embodiment of a system for controlling heat dissipation of an electrical cabinet is provided.

Figure 7:
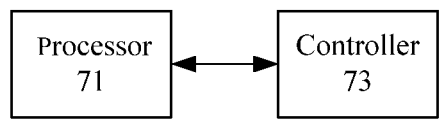
FIG. 7 is a schematic diagram of a system for controlling heat dissipation of an electrical cabinet according to an embodiment of the disclosure.

FIG. 7 is a schematic diagram of a system for controlling heat dissipation of an electrical cabinet according to an embodiment of the disclosure. As shown in FIG. 7, the system includes a processor 71 and a controller 73.

The processor 71 is configured to predict a heating capacity in the electrical cabinet, and determine, according to the heating capacity predicted, a corresponding heat dissipating capacity.

The control component 73 is connected with the processor, and is configured to control a rotational speed of a heat dissipation fan, so that a difference between the heating capacity and the heat dissipating capacity is within a predetermined range.

Specifically, the above-mentioned predetermined range is an error range between the heating capacity and the heat dissipation capacity set in advance according to an actual demand. For example, when the heating capacity and the heat dissipation capacity need to be equal, due to the error cased by predicting or controlling the rotational speed of the heat dissipation fan, an error range may be set in advance, and it may be considered that the heating capacity and the heat dissipating capacity are equal providing that a difference between the heating capacity and the heat dissipating capacity is within the error range.

In an optional solution, during the operation of the electrical cabinet, the heating capacity in the electrical cabinet is accurately predicted, and a corresponding heat dissipation capacity is matched according to the heating capacity. Generally, since an air circulation power is provided by a heat dissipation fan for the heat dissipation of the electrical cabinet and the heat dissipation is performed in a manner of moving in cold air and moving out hot air, the difference between the heating capacity and the heat dissipating capacity is within the predetermined range by controlling the rotational speed of the heat dissipation fan, so that the balance between the heating capacity and the heat dissipating capacity is achieved.

With the adoption of the above embodiment of the disclosure, the heating capacity in the electrical cabinet is predicted; according to the heating capacity predicted, the corresponding heat dissipation capacity is determined; and the rotational speed of the heat dissipation fan is controlled, so that the difference between the heating capacity and the heat dissipating capacity is within the predetermined range; and therefore, the heat dissipation control of the electrical cabinet is implemented. It is easily to be noted that since the heating capacity in the electrical cabinet is directly predicted, and a matched heat dissipation capacity is determined according to the heating capacity, the waste of the heat dissipation capacity is prevented. By further controlling the rotational speed of the heat dissipation fan, the balance between the heating capacity and the heat dissipating capacity is achieved, a temperature in the electrical cabinet is gradually stable, and a phenomenon that the temperature is fluctuated up and down is not occurred. Moreover, an air velocity of the heat dissipation fan is stable, so the heat dissipation fan does not need to be adjusted frequently, and thus the technical problem that the existing method for controlling the heat dissipation of the electrical cabinet controls the rotational speed of the heat dissipation fan by detecting the environmental temperature in the electrical cabinet so that the control is lagging and the temperature is easily fluctuated is solved. Therefore, through the above embodiment of the disclosure, the purposes that the temperature in the electrical cabinet is controlled and responded timely, the service life of the heat dissipation fan is effectively improved, and the temperature in the electrical cabinet is quickly stabilized is implemented.

Optionally, in the above embodiment of the disclosure, the system further includes a current sensor.

The current sensor is configured to detect current data of a conductor in the electrical cabinet.

The processor includes a first processing element and a second processing element. The first processing element is configured to acquire an equivalent resistance of the conductor.

The second processing element is respectively connected with the current sensor and the first processing element, and is configured to obtain a heat load of the electrical cabinet according to the current data and the equivalent resistance, wherein the heat load is the heating capacity predicted.

In an optional solution, the conductor in the electrical cabinet generally is a copper bar or a copper cable. According to the resistance formula of the conductor: $R=\rho*L/S$, the equivalent resistance R of the conductor in the electrical cabinet is calculated, wherein the unit of the equivalent resistance R is $\Omega$, the unit of the specific resistance $\rho$ is $\Omega*mm^2/m$, the unit of the length L of the conductor is m, and the unit of the cross sectional area S of the conductor is $mm^2$. The current data detected by the current sensor in the electrical cabinet is acquired, and according to a heating power formula of the conductor: $P=I^2R$, the heating power P is obtained, wherein the unit of the heating power P is w and the unit of the current data I is A. As the current data are monitored in real time, the heating power is a real-time heat load of the electrical cabinet.

Optionally, in the above embodiment of the disclosure, the processor may include a third processing element.

The third processing element is configured to take the heating capacity predicted as the heat dissipating capacity.

In an optional solution, during the operation of the electrical cabinet, since the current data I are known, the real-time heating capacity P of a cabinet body may be directly predicted; then, the rotational speed of the heat dissipation fan is controlled, so that the heat dissipation capacity Q is equal to the heating capacity P, that is $Q=P=I^2R$. At this moment, the heating capacity of the cabinet body is equal to the heat dissipation capacity, so neither a phenomenon that the heating capacity is greater than the heat dissipation capacity and the temperature in the cabinet is increased nor a phenomenon that the heating capacity is smaller than the heat dissipation capacity and the temperature in the cabinet is reduced is occurred. The temperature in the electrical cabinet is gradually stable to be close to a room temperature.

Optionally, in the above embodiment of the disclosure, the processor may include a fifth processing element.

The fifth processing element is configured to calculate a difference between the heating capacity in the electrical cabinet and a first preset threshold value to obtain a difference value, and take the difference value as the heat dissipation capacity.

Specifically, the above-mentioned first preset threshold value may be a threshold value set according to the actual demand when the heat dissipation capacity is smaller than the heating capacity.

In an optional solution, since a working temperature range of an electrical component generally is higher than the room temperature, the heat dissipation capacity is reduced by appropriately lowering the rotational speed of the heat dissipation fan, so that the heat dissipation capacity Q is slightly smaller than the heating capacity P in the electrical cabinet: $Q<P=I^2R$. At this moment, the temperature in the electrical cabinet gradually reaches a value slightly higher than a surrounding environmental temperature outside the electrical cabinet, and at last a balance is achieved, and the heat of a portion of which the heating capacity is greater than the heat dissipation capacity is transferred to a surrounding environment via a surface of the cabinet body of the electrical cabinet.

Optionally, in the above embodiment of the disclosure, the processor may include a fourth processing element.

The fourth processing element is configured to calculate a sum for the heating capacity in the electrical cabinet and a second preset threshold value to obtain a sum value, and take the sum value as the heat dissipation capacity.

Specifically, the above-mentioned second preset threshold value may be a threshold value set according to the actual demand when the heat dissipation capacity is greater than the heating capacity.

In an optional solution, in a case where a component in the electrical cabinet needs a low temperature, the heat dissipation capacity is increased, so that the heat dissipation capacity is slightly higher than the heating capacity in the electrical cabinet: $Q>P=I^2R$. At this moment, the temperature in the electrical cabinet gradually reaches to a value slightly lower than the surrounding environmental temperature outside the electrical cabinet, and at last a balance is achieved. Since the heating capacity is smaller than the heat dissipation capacity, the surrounding environment transfers the heat to the electrical cabinet via the surface of the cabinet body of the electrical cabinet. However, the above method is disadvantageous to a utilization rate of the energy, and excessive heat dissipation capacity is wasted.

Optionally, in the above embodiment of the disclosure, the processor is further configured to calculate a rotational speed of the heat dissipation fan according to the heat dissipation capacity, and the processor further includes a sixth processing element.

The sixth processing element is configured to obtain a heat dissipation air flow according to the heat dissipation capacity, and determine the rotational speed of the heat dissipation fan according to the heat dissipation air flow.

In an optional solution, since an air circulation power is generally provided by the heat dissipation fan for the heat dissipation of the electrical cabinet and the heat dissipation is performed in a manner of moving in cold air and moving out hot air, the heat dissipation air flow V is obtained according to a formula of the heat that can be taken away by air circulation and heat dissipation $Q=V*\Delta T/f$, wherein the unit of the heat dissipation capacity Q is w, the unit of the heat dissipation air flow V is $m^3$, the element of the temperature difference $\Delta T$ of the air between the inlet and the outlet is ° C. and the general value is 15; and the unit of the balance coefficient is ° $C.*m^3/w$ and the general value is 3.3. At this moment, the heat dissipation capacity is controlled by only controlling the heat dissipation air flow, and the heat dissipation air flow is implemented by the rotational speed of the heat dissipation fan.

Embodiment 4

According to an embodiment of the disclosure, an embodiment of an electrical cabinet is provided, which includes: a system for controlling heat dissipation of an electrical cabinet according to any one of the third embodiment.

With the adoption of the above embodiment of the disclosure, the heating capacity in the electrical cabinet is predicted; according to the heating capacity predicted, the corresponding heat dissipation capacity is determined; and the rotational speed of the heat dissipation fan is controlled, so that the difference between the heating capacity and the heat dissipating capacity is within the predetermined range; and therefore, the heat dissipation control of the electrical cabinet is implemented. It is easily to be noted that since the heating capacity in the electrical cabinet is directly predicted, and a matched heat dissipation capacity is determined according to the heating capacity, the waste of the heat dissipation capacity is prevented. By further controlling the rotational speed of the heat dissipation fan, a balance between the heating capacity and the heat dissipating capacity is achieved, a temperature in the electrical cabinet is gradually stable, and a phenomenon that the temperature is fluctuated up and down is not occurred. Moreover, an air velocity of the heat dissipation fan is stable, so the heat dissipation fan does not need to be adjusted frequently, and thus the technical problem that the existing method for controlling the heat dissipation of the electrical cabinet controls the rotational speed of the heat dissipation fan by detecting the environmental temperature in the electrical cabinet so that the control is lagging and the temperature is easily fluctuated is solved. Therefore, through the above embodiment of the disclosure, the purposes that the temperature in the electrical cabinet is controlled and responded timely, the service life of the heat dissipation fan is effectively improved, and the temperature in the electrical cabinet is quickly stabilized is implemented.

Each functional component provided by this embodiment of the disclosure may run in the electrical cabinet or a similar arithmetical device, and may also be taken as a part of a storage medium to store.

Therefore, an embodiment of the disclosure may provide an electrical cabinet.

In this embodiment, the electrical cabinet executes a program code of the following steps in the method for controlling heat dissipation of an electrical cabinet: a heating capacity in the electrical cabinet is provided; according to the heating capacity predicted, a corresponding heat dissipating capacity is determined; and a rotational speed of a heat dissipation fan is controlled, so that a difference between the heating capacity and the heat dissipating capacity is within a predetermined range.

Optionally, the electrical cabinet includes: at least one processor, a memory and a transmission device.

The memory is configured to store a software program and a component, such as a program instruction/component corresponding to the method and the device for controlling the heat dissipation of the electrical cabinet in this embodiment of the disclosure; and the processors execute various functional applications and data processing by running the software program and the component stored in the memory, so that the method for controlling the heat dissipation of the electrical cabinet is implemented. The memory may include a high-speed Random-Access Memory (RAM) and may further include a non-volatile memory such as at least one magnetic storage device, a flash memory or other non-volatile solid memories. In some examples, the memory may further include memories disposed remotely relative to the processors, and these remote memories may be connected to the terminal via a network. Examples of the network may include but not limited to an Internet, an Intranet, a local area network, a mobile communication network and a combination thereof.

The transmission device is configured to receive or send data via one network. Specific examples of the network may include a wired network and a wireless network. In one example, the transmission device may include a Network Interface Controller (NIC), and is connected with other network devices and routers via a network cable, so that the transmission device may communicate with the Internet or the local area network. In one example, the transmission device may be a Radio Frequency (RF) component that is configured to communicate with the Internet via a wireless manner.

Specifically, the memory is configured to store a length of the conductor in the electrical cabinet, the cross sectional area of the conductor in the electrical cabinet, and the predetermined range as well as application programs.

The processor may invoke the information and the application programs stored in the memory via the transmission device, so as to execute a program code of a method step in each optional or preferred embodiment in the method embodiment.

It may be understood by those of ordinary skill in the art that all or a part of steps in various methods of the above embodiments may be completed by enabling a program to direct related hardware of the electrical cabinet. The program may be stored in a readable storage medium of the electrical cabinet, and the storage medium includes: a flash disk, a Read-Only Memory (ROM), an RAM, a magnetic disk or an optical disc, etc.

An embodiment of the disclosure a storage medium is provided. Optionally, in this embodiment, the storage medium may be configured to store a program code executed by the method for controlling the heat dissipation of the electrical cabinet provided by the method embodiment and the device embodiment.

Optionally, in this embodiment, the storage medium is configured to store a program code for executing the following steps: the heating capacity in the electrical cabinet is predicted; according to the heating capacity predicted obtained by prediction, the corresponding heat dissipating capacity is determined; and the rotational speed of the heat dissipation fan is controlled, so that the difference between the heating capacity and the heat dissipating capacity is within the predetermined range.

Optionally, in this embodiment, the storage medium is further configured to store a program code of each preferred or optional method step provided by the method for controlling the heat dissipation of the electrical cabinet.

The method and the device for controlling the heat dissipation of the electrical cabinet according to the disclosure are described above with reference to drawings in a manner of examples. However, those skilled in the art should understand that various improvements may be made to the method and the device for controlling the heat dissipation of the electrical cabinet provided by the disclosure without departing from a content of the disclosure. Therefore, a scope of protection of the disclosure should be determined by a content of appended claims.

Numerals of the embodiments of the disclosure are only for description, and do not represent a precedence of the embodiments.

In the above embodiments of the disclosure, each embodiment is described with its emphasis. A portion not detailed in some embodiment may be referred to related description of other embodiments.

In some embodiments provided by the disclosure it should be understood that the disclosed technical content may be implemented in another manner. The device embodiment described above is only schematic, and for example, the division of the elements is only logic function division, and other division manners may be adopted during practical implementation. For example, multiple elements or components may be combined or integrated into another system, or some characteristics may be neglected or not executed. In addition, coupling, or direct coupling or communication connection between each displayed or discussed component may be indirect coupling or communication connection, implemented through some interfaces, of the elements or the components, and may be electrical or adopt other forms.

The elements described as separate parts may or may not be physically separated, and parts displayed as elements may or may not be physical elements, and namely may be located in the same place, or may also be distributed to multiple elements. Part or all of the elements may be selected to achieve the purpose of the solutions of the embodiments according to a practical requirement.

In addition, each function element in each embodiment of the disclosure may be integrated into a processing element, each element may also exist independently, and at least two elements may also be integrated into a element. The integrated element may be implemented in a hardware form, and may also be implemented in form of software function element.

When being implemented in form of software function element and sold or used as an independent product, the integrated element of the disclosure may also be stored in a computer-readable storage medium. Based on such an understanding, the technical solutions of the embodiments of the disclosure substantially or parts making contributions to the prior art or all or parts of the technical content may be embodied in form of software product, and the computer software product is stored in a storage medium, including a plurality of instructions configured to enable a piece of computer equipment (which may be a personal computer, a server, a network equipment or the like) to execute all or part of the method in each embodiment of the disclosure. The above-mentioned storage medium includes: various media capable of storing program codes such as mobile storage equipment, a ROM, a RAM, a magnetic disk or an optical disk.

The above are only preferred embodiments of the disclosure. It should be pointed out that a plurality of improvements and modifications may be made by those of ordinary skill in the art without departing from the principle of the disclosure. These improvements and modifications are also considered as the scope of protection of the disclosure.

INDUSTRIAL APPLICABILITY

The technical solutions provided by the embodiments of the disclosure may be applied to a heat dissipation process of the electrical cabinet. By adopting the solutions in which the heating capacity in the electrical cabinet is predicted, according to the heating capacity predicted obtained by the prediction, the corresponding heat dissipation capacity is determined; and the rotational speed of the heat dissipation fan is controlled, so that the difference between the heating capacity and the heat dissipating capacity is within the predetermined range, the problem that the existing method for controlling the heat dissipation of the electrical cabinet controls the rotational speed of the heat dissipation fan by detecting the environmental temperature in the electrical cabinet so that the control is lagging and the temperature is easily fluctuated may be solved, and the effects that the temperature in the electrical cabinet is controlled and responded timely, the service life of the heat dissipation fan is effectively improved, and the temperature in the electrical cabinet is stabilized quickly are implemented.

What is claimed is:

1. A method for controlling heat dissipation of an electrical cabinet, comprising:
    predicting a heating capacity in the electrical cabinet;
    determining, according to the heating capacity predicted, a corresponding heat dissipation capacity; and
    controlling a rotational speed of a heat dissipation fan, so that a difference between the heating capacity and the heat dissipation capacity is within a predetermined range, wherein the difference between the heating capacity and the heat dissipation capacity refers to a value obtained by subtracting the heat dissipation capacity from the heating capacity;
    wherein predicting the heating capacity in the electrical cabinet comprises:
    acquiring current data, detected by a current sensor, of a conductor in the electrical cabinet;
    acquiring an equivalent resistance of the conductor; and
    obtaining, according to the current data and the equivalent resistance, a heat load of the electrical cabinet, wherein the heat load is the heating capacity predicted;
    wherein when a working temperature range of an electrical component includes the room temperature, determining, according to the heating capacity obtained by prediction, the corresponding heat dissipation capacity comprises:
    taking the heating capacity predicted as the heat dissipation capacity;
    wherein when the working temperature range of the electrical component is higher than the room temperature, determining, according to the heating capacity obtained by prediction, the corresponding heat dissipation capacity comprises:
    calculating a difference between the heating capacity in the electrical cabinet and a first preset threshold value to obtain a difference value; and
    taking the difference value as the heat dissipation capacity;
    wherein when the working temperature range of the electrical component is lower than the room temperature, determining, according to the heating capacity obtained by prediction, the corresponding heat dissipation capacity comprises:
    calculating a sum for the heating capacity in the electrical cabinet and a second preset threshold value to obtain a sum value; and
    taking the sum value as the heat dissipation capacity.

2. The method as claimed in claim 1, wherein the equivalent resistance R of the conductor of the electrical cabinet and the heat load P of the electrical cabinet are calculated via following formulas:

$$R=\rho*L/S,$$

$$P=I^2R,$$

wherein, the $\rho$ is a specific resistance, the L is a length of the conductor in the electrical cabinet, the S is a cross sectional area of the conductor in the electrical cabinet, and the I is the current data.

3. The method as claimed in claim 1, wherein after determining the corresponding heat dissipation capacity, the method further comprising: calculating, according to the heat dissipation capacity, a rotational speed of the heat dissipation fan; and calculating, according to the heat dissipation capacity, the rotational speed of the heat dissipation fan comprises:
    obtaining a heat dissipation air flow according to the heat dissipation capacity; and
    determining the rotational speed of the heat dissipation fan according to the heat dissipation air flow.

4. The method as claimed in claim 3, wherein the heat dissipation air flow V is calculated via a following formula:

$$Q=V*\Delta T/f,$$

wherein, the Q is the heat dissipation capacity, the $\Delta T$ is a temperature difference of air between an inlet and an outlet of the electrical cabinet, and the f is a balance coefficient.

5. A device for controlling heat dissipation of an electrical cabinet, comprising:
    a prediction component, configured to predict a heating capacity in the electrical cabinet;
    a determination component, configured to determine, according to the heating capacity predicted, a corresponding heat dissipation capacity; and
    a control component, configured to control a rotational speed of a heat dissipation fan, so that a difference between the heating capacity and the heat dissipation capacity is within a predetermined range, wherein the difference between the heating capacity and the heat dissipation capacity refers to a value obtained by subtracting the heat dissipation capacity from the heating capacity;
    wherein, the prediction component is implemented in the following steps to predict the heating capacity in the electrical cabinet:

wherein predicting the heating capacity in the electrical cabinet comprises:

acquiring current data, detected by a current sensor, of a conductor in the electrical cabinet;

acquiring an equivalent resistance of the conductor; and obtaining, according to the current data and the equivalent resistance, a heat load of the electrical cabinet, wherein the heat load is the heating capacity predicted;

wherein the determination component configured to take the heating capacity predicted as the heat dissipation capacity, when a working temperature range of an electrical component includes the room temperature;

wherein the determination component configured to calculate a difference between the heating capacity in the electrical cabinet and a first preset threshold value to obtain a difference value, and take the difference value as the heat dissipation capacity, when the working temperature range of the electrical component is higher than the room temperature;

wherein the determination component configured to calculate a sum for the heating capacity in the electrical cabinet and a second preset threshold value to obtain a sum value, and take the sum value as the heat dissipation capacity, when the working temperature range of the electrical component is lower than the room temperature.

6. A system for controlling heat dissipation of an electrical cabinet, comprising:

a processor, configured to predict a heating capacity m the electrical cabinet, and determine, according to the heating capacity predicted, a corresponding heat dissipation capacity; and a controller, connected with the processor, and configured to control a rotational speed of a heat dissipation fan, so that a difference between the heating capacity and the heat dissipation capacity is within a predetermined range, wherein the difference between the heating capacity and the heat dissipation capacity refers to a value obtained by subtracting the heat dissipation capacity from the heating capacity;

wherein the system further comprising:

a current sensor, configured to detect current data of a conductor in the electrical cabinet; and the processor comprises: a first processing element, configured to acquire an equivalent resistance of the conductor; and a second processing element, respectively connected with the current sensor and the first processing element, and configured to obtain, according to the current data and the equivalent resistance, a heat load of the electrical cabinet, wherein the heat load is the heating capacity predicted;

wherein the processor comprises:

a third processing element, configured to take the heating capacity predicted as the heat dissipation capacity, when a working temperature range of an electrical component includes the room temperature;

a fourth processing element, configured to calculate a difference between the heating capacity in the electrical cabinet and a first preset threshold value to obtain a difference value, and take the difference value as the heat dissipation capacity, when the working temperature range of the electrical component is higher than the room temperature; and a fifth processing element, configured to calculate a sum for the heating capacity in the electrical cabinet and a second preset threshold value to obtain a sum value; and take the sum value as the heat dissipation capacity, when the working temperature range of the electrical component is lower than the room temperature.

7. The system as claimed in claim 6, wherein the processor is further configured to calculate, according to the heat dissipation capacity, a rotational speed of the heat dissipation fan; and the processor further comprises:

a sixth processing element, configured to obtain a heat dissipation air flow according to the heat dissipation capacity; and determine the rotational speed of the heat dissipation fan according to the heat dissipation air flow.

8. An electrical cabinet, comprising the system for controlling the heat dissipation of the electrical cabinet according to any one of claim 6 or 7.

* * * * *